United States Patent
Toyoda et al.

(10) Patent No.: US 8,937,430 B2
(45) Date of Patent: Jan. 20, 2015

(54) ELECTROLUMINESCENCE DISPLAY DEVICE

(71) Applicant: Japan Display Inc., Tokyo (JP)

(72) Inventors: Hironori Toyoda, Chiba (JP); Toshihiro Sato, Mobara (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/010,875

(22) Filed: Aug. 27, 2013

(65) Prior Publication Data

US 2014/0062294 A1 Mar. 6, 2014

(30) Foreign Application Priority Data

Aug. 31, 2012 (JP) ................ 2012-192132

(51) Int. Cl.
*H01L 51/52* (2006.01)
*H05B 33/12* (2006.01)
*H01L 27/32* (2006.01)

(52) U.S. Cl.
CPC ............ *H05B 33/12* (2013.01); *H01L 51/5284* (2013.01); *H01L 27/322* (2013.01); *H01L 27/3246* (2013.01)
USPC ......................................... 313/512; 313/498

(58) Field of Classification Search
CPC .............. H01L 27/322; H01L 51/5284; H01L 27/3246; H01L 51/5237; H01L 27/3211; H01L 51/5262; H01L 2251/558; H01L 51/0059; H01L 2251/5315; H01L 27/3244; H01L 51/0005; H01L 51/0036; H01L 51/0038; H01L 51/00; H01L 51/0039; H01L 51/0043; H01L 51/0545; H01L 51/5206; H01L 51/524; H01L 51/5246; H01L 51/5265; H01L 51/5281; H01L 51/56; H01L 2251/5369; H01L 23/00; H01L 27/3206; H01L 27/3209; H01L 51/002; H01L 51/005; H01L 51/0081; H01L 51/5218; H01L 51/5271; G02B 5/201; G02B 5/223; G02B 2207/113; H05B 33/14; H05B 33/02

USPC .................................................. 313/498–512
See application file for complete search history.

(56) References Cited

U.S. PATENT DOCUMENTS

2008/0246396 A1* 10/2008 Watanabe et al. ............. 313/512
2011/0221741 A1* 9/2011 Kawamura et al. ........... 345/214

FOREIGN PATENT DOCUMENTS

JP  2008-034591     2/2008
JP  4262902         2/2009
KR  10-2010-0136678 12/2010

OTHER PUBLICATIONS

Partial Translation of the Office Action for Korean Patent Application No. 10-2013-0101500, dated Jul. 31, 2014.

*Primary Examiner* — Donald Raleigh
(74) *Attorney, Agent, or Firm* — Antonelli, Terry, Stout & Kraus, LLP.

(57) ABSTRACT

An EL display device with color filter capable of surpressing color mixture. The EL display device includes: a first substrate having lower electrodes, a pixel separation film that separates the lower electrodes from each other, and an EL layer of white light emission; a second substrate having a black matrix and a color filter; and a sealing layer, in which the following Expression is satisfied.

$$W > 2\tan(\theta_m)(H_{BM} + H + H_G + H_S) - (W_S + W_{BM})$$

where W is a width of an aperture area, $W_{BM}$ is a width of the black matrix, $W_S$ is a width of the pixel separation films, $H_{BM}$ is a thickness of the black matrix, H is a thickness of the color filter, $H_G$ is a distance between a front surface of the pixel separation film and a color filter rear surface, $H_S$ is a height of the pixel separation film, and $\theta_m$ is a critical angle between the second substrate and an air.

2 Claims, 4 Drawing Sheets

ELECTROLUMINESCENCE DISPLAY DEVICE

CROSS-REFERENCE TO RELATED APPLICATION

The present application claims priority from Japanese application JP 2012-192132 filed on Aug. 31, 2012, the content of which is hereby incorporated by reference into this application.

BACKGROUND OF THE INVENTION

1. Field of the Invention

The present invention relates to an electroluminescence display device.

2. Description of the Related Art

JP 4262902 B discloses an organic electroluminescence (hereinafter referred to as EL) display device of a top emission system with color filter. This publication discloses that a light emitting element layer of the organic EL display device emits a white light in all of pixels, and a color filter layer is formed on a transparent sealing member as a color element. Also, a light blocking member is arranged in a gap (sealed space) between an element substrate and the transparent sealing member, and light leakage is prevented between the pixels.

When a structure of a top emission type is applied to the EL display device, particularly, in a high-definition or small-sized display device in which the individual pixels are fine, because dimensions of sizes of the pixels and thickness of a color filter are relatively close to each other, there arises such a problem that light emission occurring in a white organic EL layer is propagated in a space between an insulating substrate and a sealing substrate, or in a resin layer, and enters adjacent pixels to generate color mixture. A structure disclosed in JP 4262902 B is configured to solve the above problem. However, this structure suffers from problems that process costs for forming a light blocking wall are required, the light blocking wall narrow in a width is difficult to form in the high-definition or small-sized display device, and an aperture ratio is lessened.

SUMMARY OF THE INVENTION

The present invention has been made in view of the above viewpoints, and an object of the present invention is to reduce the degradation of an image quality attributable to the color mixture in an EL display device with color filter.

An outline of a typical feature of the invention discloses in the present application will be described in brief below.

(1) An EL display device including: a first substrate having lower electrodes which are formed on a front surface for respective pixels, a pixel separation film that separates the lower electrodes from each other, and an EL layer of white light emission which are formed on upper layers of the lower electrodes and the pixel separation films; a second substrate having a black matrix and a color filter on a back surface thereof; and a sealing layer sandwiched between the first substrate and the second substrate,
wherein the following Expression is satisfied.

$$W > 2\tan(\theta_m)(H_{BM} + H + H_G + H_S) - (W_S + W_{BM})$$

where
$W$ is a width of an aperture area in a specific pixel,
$W_{BM}$ is a width of the black matrix,
$W_S$ is a width of the pixel separation films $H_{BM}$ is a thickness of the black matrix
$H$ is a thickness of the color filter in the specific pixel
$H_G$ is a distance between a front surface of the pixel separation film and a color filter rear surface of the specific pixel,
$H_S$ is a height of the pixel separation film (a distance between a front surface of the lower electrode and the front surface of the pixel separation film), and
$\theta_m$ is a critical angle between the second substrate and an air.

(2) In the EL display device according to the item (1), $H_G \geq 3$ [μm] is satisfied.

According to the above item (1), in the EL display device of the color filter system, the degradation of the image quality attributable to color mixture can be reduced.

According to the above item (2), further the incidence of defects during manufacturing can be reduced.

DETAILED DESCRIPTION OF THE INVENTION

Hereinafter, an EL display device according to an embodiment of the present invention will be described with reference to the drawings.

Figure 1:
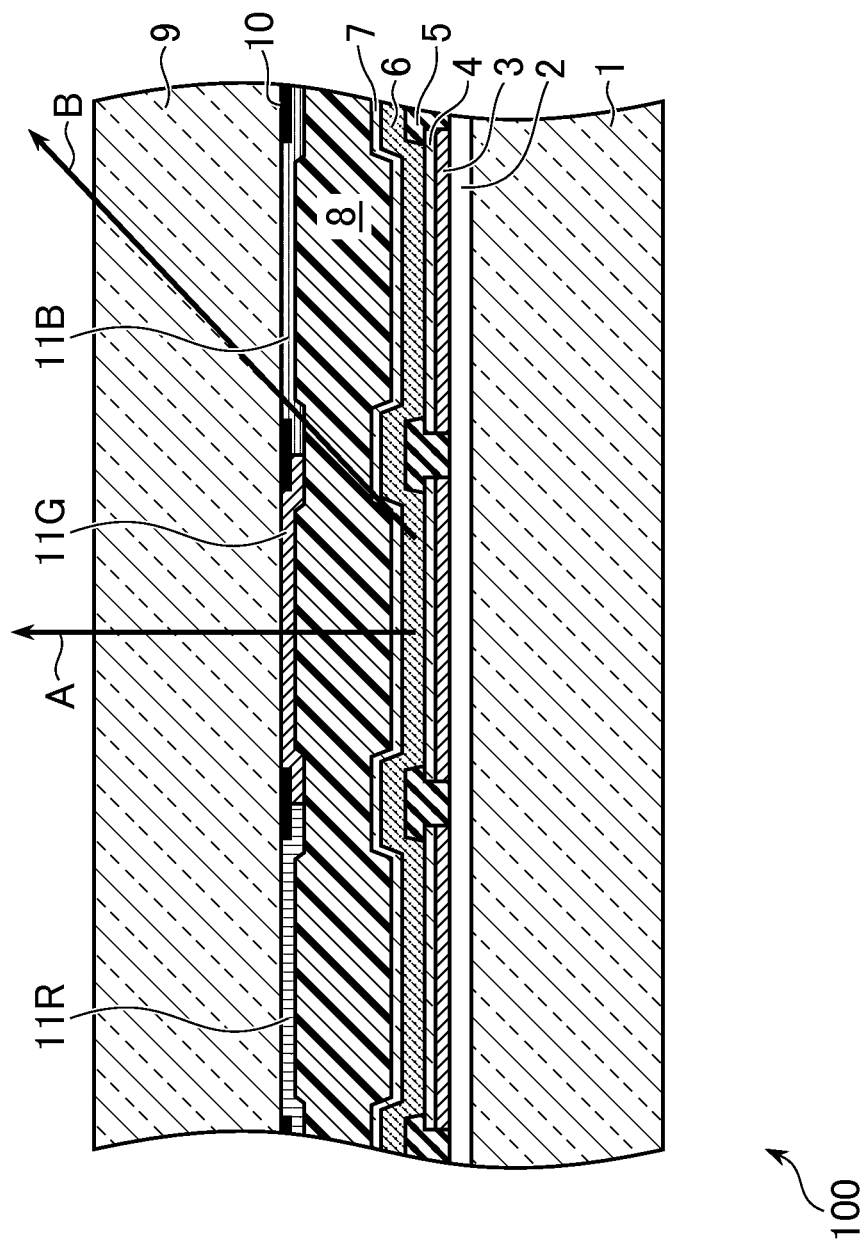
FIG. 1 is a partially cross-sectional view illustrating a pixel portion in an EL display device according to an embodiment of the present invention.

FIG. 1 is a partially cross-sectional view illustrating a pixel portion in an EL display device 100 according to the embodiment of the present invention.

In the EL display device 100, a large number of pixels are regularly arranged on a first substrate 1 of insulation, the amount of luminescence of an EL layer 6 at positions corresponding to respective pixels is controlled to form an image. For that reason, a circuit layer 2 in which an electric circuit including TFTs (thin film transistors) for controlling the amount of current flowing in the respective pixels is arranged regularly (in a grid pattern in this embodiment) is formed on the first substrate 1. The first substrate 1 is formed of a glass substrate in this embodiment, but a material of the first substrate 1 is not particularly limited if the substrate has an insulation property, and may be a synthetic resin or another material. Also, transparency or opacity thereof is no object.

The circuit layer 2 includes an appropriate insulating layer, lines including scanning signal lines, video signal lines, power lines, and ground lines, and a TFT including the respective electrodes of gates, sources, and drains, and a semiconductor layer. Since the electric circuit configuring the circuit layer, and a cross-sectional structure thereof are known, their details will be omitted, and the electric circuit is simplified and illustrated merely as the circuit layer 2.

Reflection layers 3 are disposed on the circuit layer 2 for each of the pixels, independently. The reflection layers 3 have a function of reflecting a light emitted from the EL layer 6 disposed on an upper layer of the reflection layers 3. The reflection layers 3 may be each formed of an appropriate metal film, and made of, for example, aluminum, chromium, or silver, or an alloy of those materials. When the reflection layers 3 and lower electrodes 4 to be described subsequently are isolated from each other through an arbitrary insulating layer, the reflection layers 3 may not always be disposed for each of the pixels, independently. For example, the reflection layers 3 may be so disposed as to cover an overall area of a region in which the pixels of the EL display device 100 are arranged.

Each of the lower electrodes 4 is disposed on the upper layer of the corresponding reflection layer 3 for each of the pixels. The lower electrodes 4 are separated and isolated from each other by pixel separation films 5 (also called banks). The lower electrodes 4 are each formed of a transparent conductive film, and preferably made of a conductive metal oxide such as ITO (indium tin oxide) or InZnO (indium zinc oxide), or a material in which metal such as silver is mixed into the conductive metal oxide. Also, the pixel separation films 5 may be any material if the material has an insulation material, and made of an organic insulating material such as polyimide or acrylic resin, or a silicon nitride. The pixel separation films 5 are arranged along boundaries of the respective pixels, and the respective pixels are separated from each other.

The EL layer 6 is disposed on the upper layers of the lower electrodes 4 and the pixel separation films 5. The EL layer 6 is not independent from each other for each of the pixels, and disposed to cover the overall area of the region in which the pixels in the EL display device 100 are arranged. Also, emission color of the EL layer 6 is white. EL materials that emit lights of a plurality of colors, for example, each colors of red, green, and blue, or yellow and blue are laminated on each other to obtain the white light emission as a synthetic color. However, in this embodiment, a specific configuration of the EL layer 6 is not particularly limited, but any single layer/laminated layer, and any layer structure thereof are applicable if the white light emission is resultantly obtained. Also, a material of the EL layer may be organic or inorganic, but an organic material is used in this embodiment.

Further, an upper electrode 7 is disposed on an upper portion of the EL layer 6. The upper electrode 7 is not also independent for each of the pixels, but disposed to cover the overall area of the region in which the pixels of the EL display device 100 are arranged. The upper electrode 7 is also formed of a transparent conductive film, and preferably made of a material in which a metal such as silver or magnesium is mixed into a conductive metal oxide such as ITO (indium tin oxide) or InZnO (indium zinc oxide), or a material in which a metal thin film of silver or magnesium, and the conductive metal oxide are laminated on each other.

A sealing layer 8 is disposed on an upper layer of the upper electrode 7 to prevent oxygen and moisture from entering the respective layers including the EL layer 6 for protection of those layers. The sealing layer 8 may be made of silicon nitride or an appropriate organic material such as an epoxy resin, or a plurality of different materials may be laminated on each other to configure the sealing layer 8. A transparent material is selected for the sealing layer 8.

A second substrate 9 is arranged to face the first substrate 1 through the sealing layer 8, and a black matrix 10 is formed on a rear surface of the second substrate 9, that is, a surface facing the first substrate 1 in a portion forming a boundary of the pixels. Color filters 11R, 11G, and 11B of colors corresponding to emission colors of the respective pixels are further formed at positions corresponding to the respective pixels so as to cover each black matrix 10. The second substrate 9 is made of glass or a synthetic resin, and transparent to the visible light. Also, the black matrix 10 is black to the visible light, that is, may be made of any material having a light absorption property. For example, the black matrix 10 may be made of a material in which carbon is mixed into a polyimide or acrylic synthetic resin. Also, the color filters 11R, 11G, and 11B are colored into red, green, and blue by mixing dye materials into an arbitrary synthetic resin, for example, the acrylic synthetic resin, respectively. In each pixel, a portion surrounded by the black matrix 10 is a region where a light is emitted, and called aperture area.

In this example, the reason why the dye materials are used for coloring the color filters 11R, 11G, and 11B is that both of a chromatic purity and a transmittance of a light beam are achieved, particularly, in the color filter 11B of blue. Therefore, the dye material does not always need to be used so far as the chromatic purity and the transmittance of the light beam comply with the specifications of the EL display device 100, and pigment materials or wavelength conversion materials such as a fluorescent material may be used instead. However, when the dye material is used for the color filter 11B of blue as in this embodiment, because there is an upper limit to a concentration of the dye material in the color filter 11B, there is a lower limit to a thickness of the color filter 11B in order to obtain a desired characteristic. The same is applied to the color filter 11R of red, and the color filter 11G of green. However, the color filter 11B is thickest so far as a material capable of being used at this time is used. In this example, as the dye material, there may be used one or a plurality of materials selected from an azo dye, an anthraquinone dye, a phthalocyanine dye, a quinonimine dye, a quinoline dye, a nitro dye, a carbonyl dye, and a methine dye.

With the above structure, the EL layer 6 present at a position corresponding to each pixel of the EL display device 100 emits a light with a luminance corresponding to the amount of current when holes and electrons of the amounts controlled by the electric circuit arranged in the circuit layer 2 are implanted into the EL layer 6 by the lower electrodes 4 and the upper electrode 7. The polarities of the lower electrodes 4 and the upper electrode 7 are not particularly limited. However, in this embodiment, the lower electrodes 4 functions as an anode, and the upper electrode 7 functions as a cathode. As is apparent from the above description and FIG. 1, the EL display device 100 is of a so-called top emission type, and an emitted light is extracted from a side of the first substrate 1 where the EL layer 6 is formed. Therefore, the side of the first substrate 1 where the EL layer 6 is formed is called front side, and an opposite side is called rear side. In FIG. 1, an upper side represents the front side.

Most of the light emitted from the EL layer 6 in a pixel (sub-pixel colored into green) indicated in the center of FIG. 1 is propagated toward the front side as indicated by an arrow A in the figure, and input to the color filter 11G of green. Only a light beam having a wavelength of green is transmitted through the color filter 11G, and extracted from the front side. As a result, the subject pixel is colored into green, and visually recognized. On the contrary, a part of light obliquely propagated among the light emitted from the EL layer 6 is input to a color filter of the adjacent pixel, in this example, the color filter 11B of blue as indicated by an arrow B in the figure. A light beam having a wavelength of blue is transmitted through the color filter 11B, and extracted from an oblique front side. For that reason, a color mixture occures when an image display surface of the EL display device 100 is obliquely viewed, and a color of a displayed image is changed in observation.

To cope with the above problem, the present inventors have found that dimensions of the respective portions of the EL display device 100 are set to appropriate values, thereby making it possible to reduce the problem on the color mixture to a level allowable in the practical use. Hereinafter, this design guide will be described with reference to FIG. 2.

Figure 2:
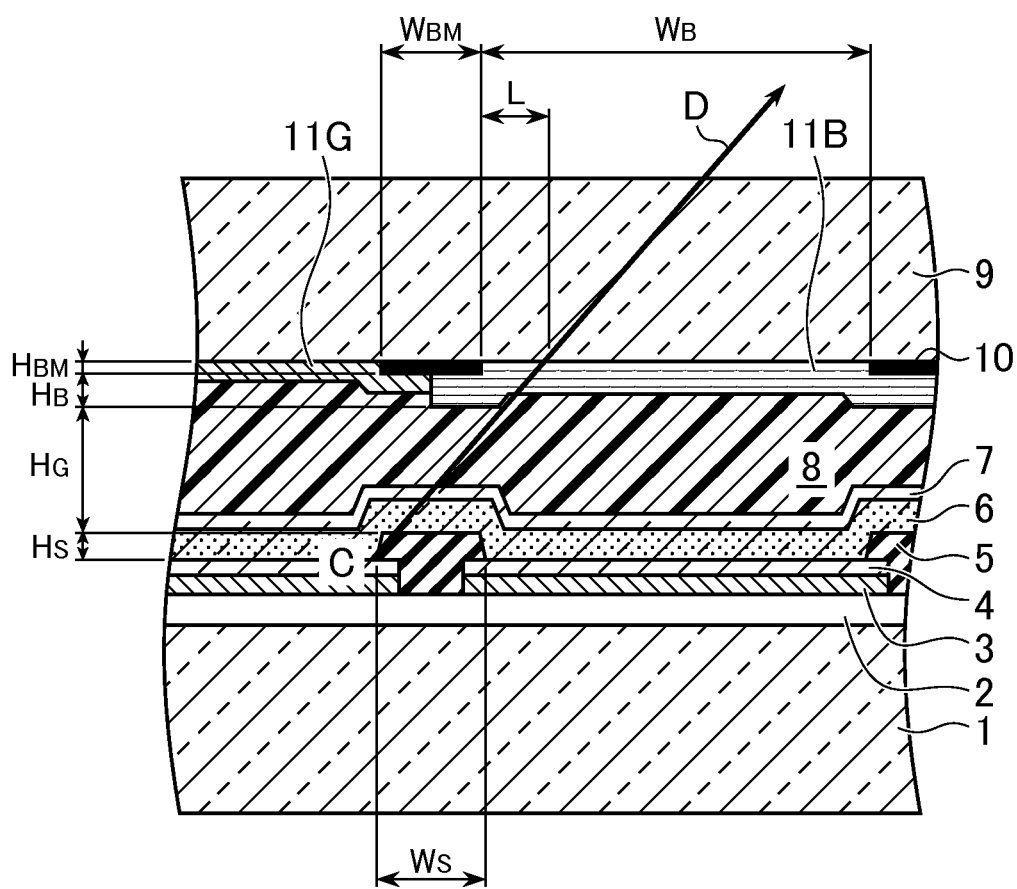
FIG. 2 is a partially enlarged cross-sectional view illustrating a right half of a center pixel (green pixel) and a right pixel (blue pixel) in FIG. 1.

FIG. 2 is a partially enlarged cross-sectional view illustrating a right half of a center pixel (green pixel) and a right pixel (blue pixel) in FIG. 1. In this example, the dimensions of the respective portions are defined as follows:

$W_B$ is a width of an aperture area in a blue pixel,
$W_{BM}$ is a width of the black matrix 10,
$W_S$ is a width of the pixel separation films 5,
$H_{BM}$ is a thickness of the black matrix 10,
$H_B$ is a thickness of the color filter 11B of blue,
$H_G$ is a distance between a front surface of the pixel separation film 5 and a rear surface of the color filter 11B of blue,
$H_S$ is a height of the pixel separation film 5 (a distance between a front surface of the lower electrode 4 and the front surface of the pixel separation film 5).

In this situation, let us consider a light beam D that is emitted obliquely from a position C (this is an end point of the pixel separation film 5 as illustrated in the figure) of the green pixel closest to the blue pixel. In order to extract the light beam D from the second substrate 9 toward the front surface, an angle of the light beam D to a normal line of the second substrate 9 has to be smaller than a critical angle (an angle at which total reflection occurs) θm between the second substrate 9 and an air. Therefore, the light beam D inclined by the angle θm with respect to the normal direction of the second substrate 9 can be considered as the most inclined light beam. When a material of the second substrate 9 is glass, $\theta_m = 41.5°$ is satisfied. In FIG. 2, it appears that the light beam D partially transverses the pixel separation films 5 because the ratios of the respective portions are different from those in actuals for convenience of the illustration, which does not need to be considered in this example.

It is assumed that a distance from a position at which the light beam D is input to a rear surface of the second substrate 9 to an end of the black matrix 10 is L. The distance L means that the color mixture occurs in a range from the end of the black matrix 10 to the distance L. In this example, a ratio of color mixture M is defined as follows.

$$M = L/W_B \quad (1)$$

Figure 3:
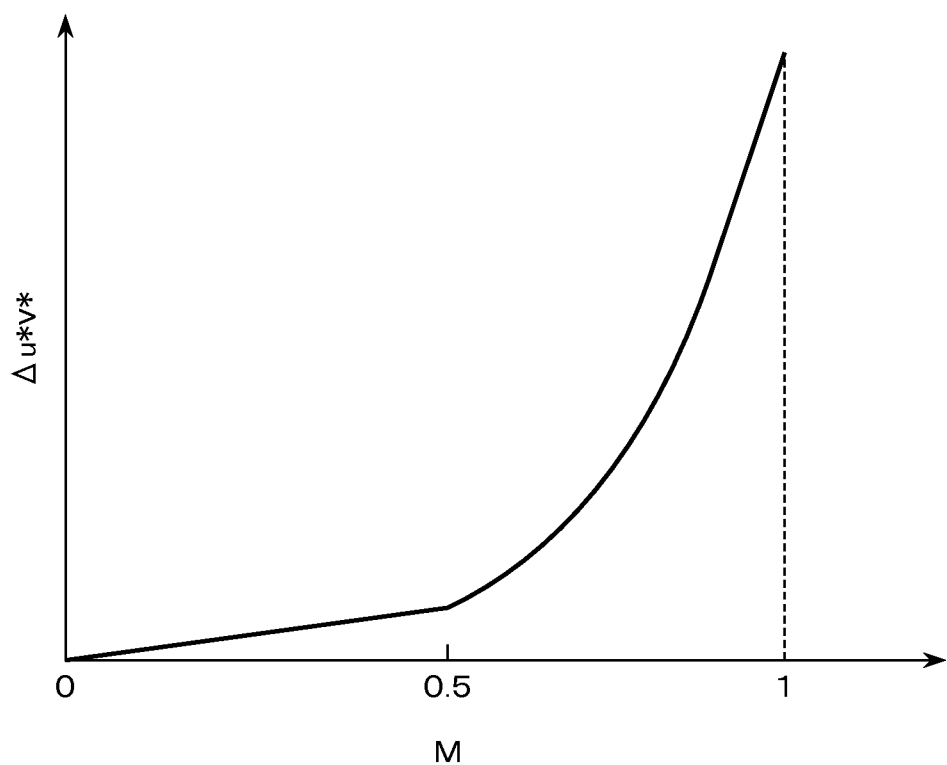
FIG. 3 is a graph illustrating a relationship between a color mixture ratio M, and a chromaticity variation $\Delta u^* v^*$ in an $L^* u^* v^*$ color system.

The ratio of color mixture M is useful as an index for evaluating the degree of change in color which is caused by the color mixture. FIG. 3 is a graph illustrating a relationship between the color mixture ratio M, and a chromaticity variation $\Delta u^* v^*$ in an $L^* u^* v^*$ color system (CIE 1976). As illustrated in the figure, when the ratio of color mixture M exceeds 0.5, the variation $\Delta u^* v^*$ of chromaticity rapidly increases. From this fact, it is found that the following expression should be satisfied.

$$M < 0.5 \quad (2)$$

Also, the following expression is satisfied according to a geometric relationship illustrated in FIG. 2.

$$\tan(\theta_m) = (W_S/2 + W_{BM}/2 + L)/(H_{BM} + H_B + H_G + H_S) \quad (3)$$

When L is eliminated from the above Expressions (1) to (3), the following expression is obtained.

$$W_B > 2\tan(\theta_m)(H_{BM} + H_B + H_G + H_S) - (W_S + W_{BM}) \quad (4)$$

This is conditions of given $H_{BM}$, $H_B$, $H_G$, $H_S$, $W_S$ and $W_{BM}$ to be fulfilled by $W_B$. In Expression (4), $W_B$ and $H_B$ are a width of the aperture area and a thickness of the color filter in the blue pixel, respectively. If $W_B$ and $H_B$ are replaced with those corresponding to the respective red pixel and green pixel, the above conditions are fulfilled, likewise. In this embodiment, the thickness $H_B$ of the color filter 11B of blue is thicker than that of the other color filters 11R and 11G, and the conditions are severest. Therefore, in the case where the widths of the aperture areas of the respective pixels are equal to each other, if Expression (4) which is the conditions of the blue pixel is fulfilled, the same conditions are fulfilled in the red pixel and the green pixel. In this embodiment, the thickness of the color filter 11B of blue is about 6 μm±1 μm whereas the thicknesses of the color filters 11R and 11G of red and green are about 2.5 μm±1 μm. If Expression (4) is more generalized, the following expression is fulfilled with the use of the width W of the aperture area in an arbitrary specific pixel, and the thickness H of the color filter in the above pixel.

$$W > 2\tan(\theta_m)(H_{BM} + H + H_G + H_S) - (W_S + W_{BM}) \quad (5)$$

Incidentally, in Expression (5) representing the generalization conditions in the color mixture, the value of W can be made smaller as a value on a right side is smaller, to thereby obtain the high-definition or small-sized display device 100. However, there are lower limits to $H_{BM}$, H, and $H_S$ due to a process restriction and a functional restriction (for example, if the values of $H_{BM}$ and H are set to be small, a desired light blocking property or chromatic property is not obtained.). Also, when $W_S$ and $W_{BM}$ are increased, the aperture ratio is lessened, and a desired luminescence is not obtained. For that reason, there are upper limits to those values $W_S$ and $W_{BM}$.

Under the circumstances, it is conceivable to lessen $H_G$. There is a lower limit to this value due to the process restriction. That is, the EL display device 100 is manufactured under an environment in which an influence of mixture of a foreign material is removed as much as possible, such as a clean room. However, it is difficult to completely remove the influence. In particular, in a process of bonding the first substrate 1 and the second substrate 9 together (this is a process of forming the sealing layer 8), the foreign matter is liable to be mixed. However, because the sealing layer 8 functions as a buffer layer against the mixed foreign matter, there is an advantage that the influence of the foreign matter mixed into the sealing layer 8 is reduced. The buffer effect is exercised when the thickness of the sealing layer 8 is sufficiently larger than the mixed foreign matter. Therefore, as described above, if $H_G$ is reduced, that is, if the thickness of the sealing layer 8 is thinned, the buffer effect is relatively liable to be affected by the mixed foreign matter to lessen the yield during manufacturing.

Figure 4:
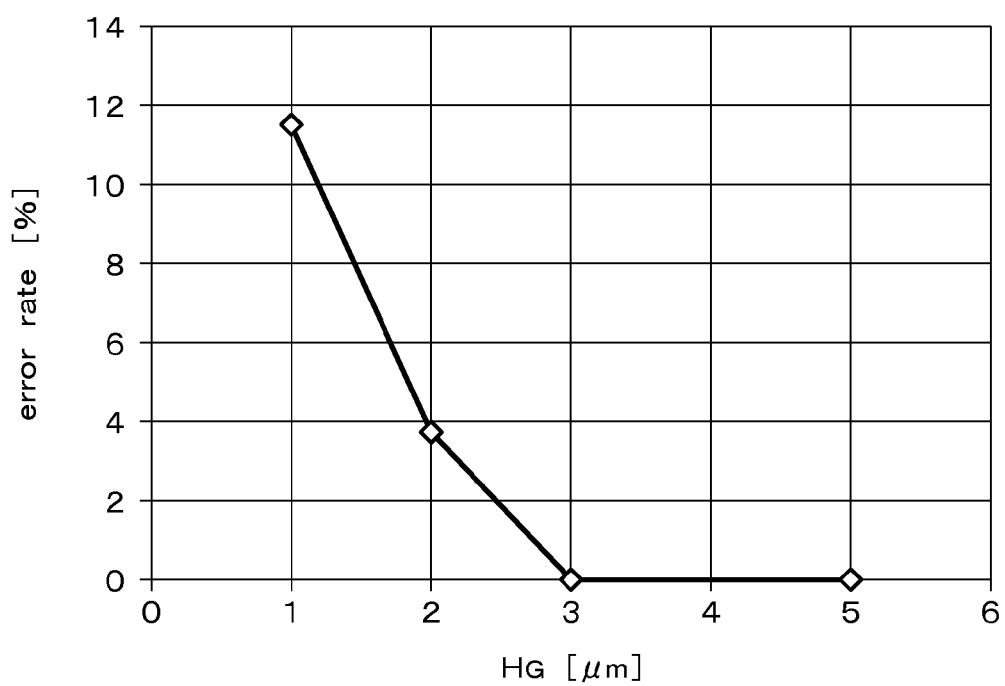
FIG. 4 is a graph illustrating a relationship between $H_G$ and the incidence of manufacturing failure.

FIG. 4 is a graph illustrating a relationship between $H_G$ and the incidence of manufacturing failure when the EL display device 100 is manufactured under an economically reasonable environment in the present situation. The incidence of the manufacturing failure represents a rate at which scotomas likely to be caused by the foreign matter are generated in the EL display device 100. As illustrated in the figure, when $H_G$ becomes lower than 3 μm, the incidence of the manufacturing failure is rapidly increased. Conceivably, this is because the incidence of the manufacturing failure is affected by a fine foreign matter that cannot be removed under the environment of the clean room obtained in the present situation when $H_G$ becomes lower than 3 μm. From this viewpoint, it is found that the following expression is fulfilled.

$$H_G \geq 3 [\mu m] \quad (6)$$

In view of the above, the EL display device 100 according to this embodiment satisfies the above-mentioned Expression (5) and Expression (6) at the same time, to thereby obtain the EL display device 100 in which the influence of the color mixture in the practical use is reduced to an acceptable extent, and the incidence of the manufacturing failure is low. The condition of Expression (6) depends on the environments of the available clean room, and if an environment better than the environment obtained in the present situation is available, the condition of Expression (6) is not always essential.

The specific forms, arrangement and the like of each member illustrated in the embodiments described above are mere examples and the invention is not limited to them. When the invention is to be implemented, those skilled in the art may arbitrary design or modify the forms or the like of each member depending on implementation.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An EL display device comprising:
a first substrate having lower electrodes which are formed on a front surface for respective pixels, a pixel separation film that separates the lower electrodes from each other, and an EL layer of white light emission which are formed on upper layers of the lower electrodes and the pixel separation films;
a second substrate having a black matrix and a color filter on a back surface thereof; and
a sealing layer sandwiched between the first substrate and the second substrate,
wherein the following Expression is satisfied, $$W > 2\tan(\theta_m)(H_{BM}+H+H_G+H_S)-(W_S+W_{BM})$$

where
  $W$ is a width of an aperture area in a specific pixel,
  $W_{BM}$ is a width of the black matrix,
  $W_S$ is a width of the pixel separation films
  $H_{BM}$ is a thickness of the black matrix
  $H$ is a thickness of the color filter in the specific pixel
  $H_G$ is a distance between a front surface of the pixel separation film and a color filter rear surface of the specific pixel,
  $H_S$ is a height of the pixel separation film (a distance between a front surface of the lower electrode and the front surface of the pixel separation film), and
  $\theta_m$ is a critical angle between the second substrate and an air.

2. The EL display device according to claim 1, wherein $H_G \geq 3$ [μm] is satisfied.

* * * * *